United States Patent [19]

Van Mastrigt

[11] Patent Number: 4,709,655
[45] Date of Patent: Dec. 1, 1987

[54] CHEMICAL VAPOR DEPOSITION APPARATUS

[75] Inventor: Max Van Mastrigt, San Jose, Calif.

[73] Assignee: Varian Associates, Inc., Palo Alto, Calif.

[21] Appl. No.: 805,029

[22] Filed: Dec. 3, 1985

[51] Int. Cl.[4] .................. C23C 16/46; C23C 16/50
[52] U.S. Cl. .................................. 118/719; 118/723; 118/725; 118/728; 118/50.1
[58] Field of Search ............... 118/719, 724, 725, 728, 118/50.1, 723

[56] References Cited

U.S. PATENT DOCUMENTS

| | | | |
|---|---|---|---|
| 2,685,124 | 8/1954 | Toulmin, Jr. | 428/612 |
| 3,098,763 | 7/1963 | Deal et al. | 118/724 |
| 3,384,049 | 5/1968 | Capita | 118/725 |
| 3,460,510 | 8/1969 | Currin | 118/720 |
| 3,477,872 | 11/1969 | Amick | 156/646 X |
| 3,540,920 | 11/1970 | Wakefield | 428/641 |
| 3,565,676 | 2/1971 | Holzl | 427/253 |
| 3,594,227 | 7/1971 | Oswald | 427/45.1 |
| 3,645,230 | 2/1972 | Hugle et al. | 118/730 |
| 3,669,724 | 6/1972 | Brand | 427/99 X |
| 3,673,983 | 7/1972 | Strater et al. | 118/48 |
| 3,697,343 | 10/1972 | Cuomo et al. | 156/646 |
| 3,699,298 | 10/1972 | Briody | 219/10.49 R |
| 3,854,443 | 12/1974 | Baerg | 118/724 |
| 3,862,397 | 1/1975 | Anderson et al. | 219/405 |
| 3,865,072 | 2/1975 | Kirkman | 118/663 |
| 3,916,822 | 11/1975 | Robinson | 118/725 |
| 4,047,496 | 9/1977 | McNeilly et al. | 118/725 |
| 4,065,369 | 12/1977 | Ogawa et al. | 204/164 |
| 4,089,992 | 5/1978 | Doo et al. | 427/94 X |
| 4,096,297 | 6/1978 | Pappis et al. | 427/294 X |
| 4,123,571 | 10/1978 | Balog et al. | 427/93 X |
| 4,154,631 | 5/1979 | Schoolar | 118/719 X |
| 4,180,596 | 12/1979 | Crowder et al. | 427/42 |
| 4,247,579 | 1/1981 | Tuft | 427/91 |
| 4,258,658 | 3/1981 | Politycki et al. | 118/719 |
| 4,276,557 | 6/1981 | Levinstein et al. | 357/67 |
| 4,310,380 | 1/1982 | Flamm et al. | 156/643 |
| 4,332,839 | 6/1982 | Levinstein et al. | 427/85 |
| 4,343,676 | 8/1982 | Tarng | 156/628 |
| 4,359,490 | 11/1982 | Lehrer | 427/95 |
| 4,391,846 | 7/1983 | Raymond | 427/99 |
| 4,392,299 | 7/1983 | Shaw | 427/84 X |
| 4,411,734 | 10/1983 | Maa | 156/643 |
| 4,446,817 | 5/1984 | Crawley | 118/725 |
| 4,458,410 | 7/1984 | Sugaki et al. | 427/84 X |
| 4,461,020 | 7/1984 | Hübner et al. | 378/143 |
| 4,470,189 | 9/1984 | Roberts et al. | 427/93 X |
| 4,501,769 | 2/1985 | Hieber et al. | 427/95 |
| 4,504,521 | 3/1985 | Widmer et al. | 427/85 |
| 4,510,670 | 4/1985 | Schwabe et al. | 29/571 |
| 4,532,702 | 8/1985 | Gigante et al. | 29/578 |
| 4,540,607 | 9/1985 | Tsao | 427/253 |
| 4,557,943 | 12/1985 | Rosler et al. | 427/38 |
| 4,565,157 | 1/1986 | Brors et al. | 118/719 |
| 4,607,591 | 8/1986 | Stitz | 118/666 |
| 4,629,635 | 12/1986 | Brors | 427/255.2 |

*Primary Examiner*—Evan K. Lawrence
*Attorney, Agent, or Firm*—Stanley Z. Cole; Gerald M. Fisher; Kenneth L. Warsh

[57] ABSTRACT

A chemical vapor deposition apparatus includes a gas mixing chamber and a water-cooled reaction chamber with adjustable water-cooled baffle between them. A wafer is clamped face down to a chuck and an inert gas such as helium is forced between the chuck and the wafer to insure proper heat conduction from chuck to wafer. The chuck can be radiantly heated from above and operated in a plasma-enhanced mode. A wafer loading apparatus driven by a computer is isolated by a loadlock during deposition to enhance cleanliness. The chamber can be plasma cleaned to reduce downtime.

20 Claims, 9 Drawing Figures

CHEMICAL VAPOR DEPOSITION APPARATUS

FIELD OF THE INVENTION

This invention relates to an improved chemical vapor deposition apparatus of the cold-wall type for deposition of highly-uniform coatings of selected elements and compounds on workpieces.

BACKGROUND OF THE INVENTION

Chemical Vapor Deposition (CVD) is the process of depositing a solid material from a gaseous phase onto a substrate by means of a chemical reaction. The deposition reaction involved is generally thermal decomposition, chemical oxidation, or chemical reduction. In one example of thermal decomposition, organometallic compounds are transported to the substrate surface as a vapor and are reduced to the elemental metal state on the substrate surface.

For chemical reduction, the reducing agent most usually employed is hydrogen, although metal vapors can also be used. The substrate can also act as a reductant as in the case of tungsten hexafluoride reduction by silicon. The substrate can also supply one element of a compound or alloy deposit. The CVD process can be used to deposit many elements and alloys as well as compounds including oxides, nitrides and carbides.

In the present invention, CVD technology can be used to manufacture deposits on substrates for a variety of purposes. Tungsten carbide and aluminum oxide wear coatings on cutting tools; corrosion resistant coatings of tantalum, boron nitride, silicon carbide and the like and tungsten coatings on steel to reduce erosion can be applied according to this invention. The apparatus and method is particularly advantageous in manufacturing solid state electronic devices and energy conversion devices.

Chemical vapor deposition of electronic materials is described by T.L. Chu et al, J. Bac. Sci. Technol. 10, 1 (1973) and B.E. Watts, Thin Solid Films 18, 1 (1973). They describe the formation and doping of epitaxial films of such materials as silicon, germanium and GaAs, for example. In the field of energy conversion, the CVD process provides materials for nuclear fission product retention, solar energy collection, and superconduction. A summary of the chemical vapor deposition field is provided by W. A. Bryant, "The Fundamentals of Chemical Vapour Deposition" in Journal of Materials Science 12, 1285 (1977), and is hereby incorporated by reference.

The deposition parameters of temperature, pressure, the ratio of reactant gases, and amount and distribution of gas flow critically determine the deposition rates and the ability of a particular system to provide the desired uniformity and quality of deposition. The limitations of prior art systems stem from their inability to adequately control one or more of these factors from deposit contamination.

The reaction chambers employed for chemical vapor deposition are generally classified as cold-wall or as hot-wall systems. In cold-wall systems, the substrate is heated by inductive coupling, radiant heating or direct electrical resistance heating of internal support elements. Hot-wall systems rely on radiant heating elements arranged to create a heated reaction and deposition zone. Conduction and convection heating approaches have also been used in hot-wall system.

Cold-wall systems for chemical vapor deposition are described in U.S. Pat. Nos. 3,594,227, 3,699,298 and 3,916,822. In these systems, the semiconductor wafers are positioned inside a vacuum chamber, and induction coils are arranged exterior to the vacuum chamber. The wafers are mounted on a susceptible material adapted for heating by RF energy. By localizing heat to the immediate semiconductor wafer area, chemical vapor deposition is limited to the heated areas. Since the unheated walls are below CVD temperatures, deposition on the walls is reduced. The temperatures in the reaction zone are usually not as uniform as those obtained with hot-wall systems, and it is impossible to control the temperature across individual wafers.

OBJECTS OF THE INVENTION

It is the object of the invention to specify a CVD apparatus for cold wall deposition in which the temperature across an individual wafer can be precisely controlled.

It is a further object in such a CVD apparatus to minimize formation of particulates and make the apparatus self-cleaning.

It is a still further object in such a CVD apparatus to make the operation automatic and computer controlled.

It is another object of such a CVD apparatus to make the gas mixing uniform and the flow even across the wafer.

SUMMARY OF THE INVENTION

This object of the invention and other objects, features and advantages to become apparant as the specification progresses are accomplished by the invention, according to which, briefly stated, a chemical vapor deposition apparatus of the cold-wall type has a separate mixing chamber in which gasses are mixed from several injection rings having a multiplicity of small holes. A water-cooled baffle is used to increase the mixing and pass the mixed gasses in a ring-shaped flow into the deposition chamber.

Multiple pumping outlets with independent adjustments on impedance are used to adjust the symmetry of flow of gas in the reaction chamber.

Wafers are coated one at a time in a face-down position on a chuck, which is capable of heating each wafer at 950° C. The face-down position minimizes particle damage to the wafer.

Wafers are handled cassette-to-cassette by an automated computer-driven handling system through a loadlock. The handling system is withdrawn from the system before closing the loadlock, thereby eliminating belts or sliding surfaces which can generate particulates and also eliminating deposition on the handling apparatus.

The wafers are held for deposition against a chuck which can be radiantly heated. The chuck can also be operated in a plasma-enhanced mode. The plasma can also be used to clean the deposition chamber with the wafer removed, thus minimizing downtime for cleaning.

The wafer chemical vapor deposition apparatus according to the invention can also lend itself to a variety of deposition processes for VLSI and ULSI applications. These include polysilicon both doped and undoped, refractory metal silicides, refractory metals, thermal nitride, plasma nitride, plasma oxides, and thermal oxides, including phosphosilicate and borophosphosilicate glasses. Films produced have good conformality, low particle density and excellent deposition thickness uniformity.

These and other constructional and operational characteristics of the invention will be more evident from the detailed description given hereinafter with reference to the figures of the accompanying drawings which illustrate preferred embodiments and alternatives by way of non-limiting examples.

DESCRIPTION OF THE PREFERRED EMBODIMENTS

Figure 1:
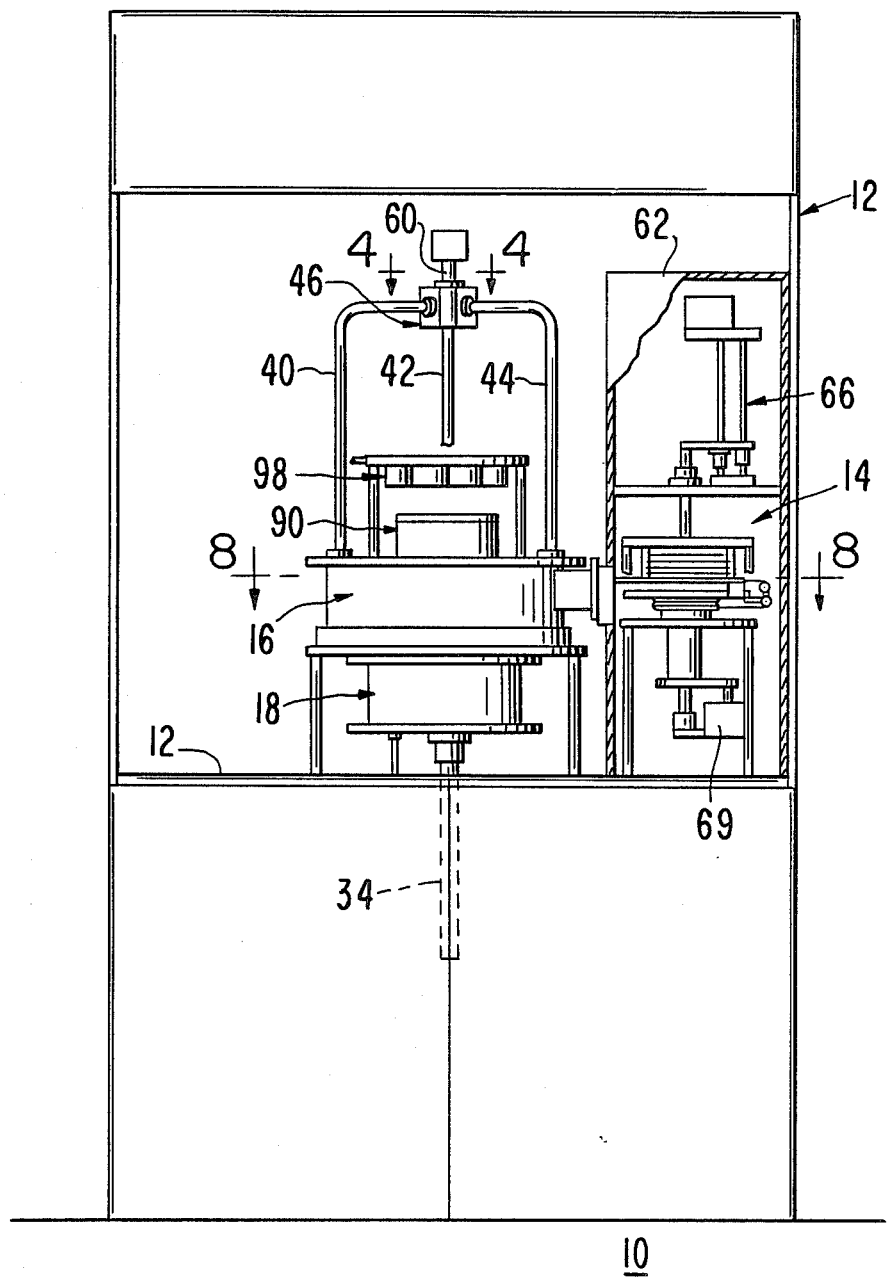
FIG. 1 shows an overall view from the front of the chemical vapor deposition apparatus according to the invention.

Referring now to the drawings wherein reference are used to designate parts throughout the various figures thereof, there is shown in FIG. 1 a general view of the chemical vapor deposition apparatus 10 according to the invention. A frame 12 supports a wafer loading apparatus 14, deposition chamber 16, gas mixing chamber 18, and exhaust manifold 46.

Figure 2:
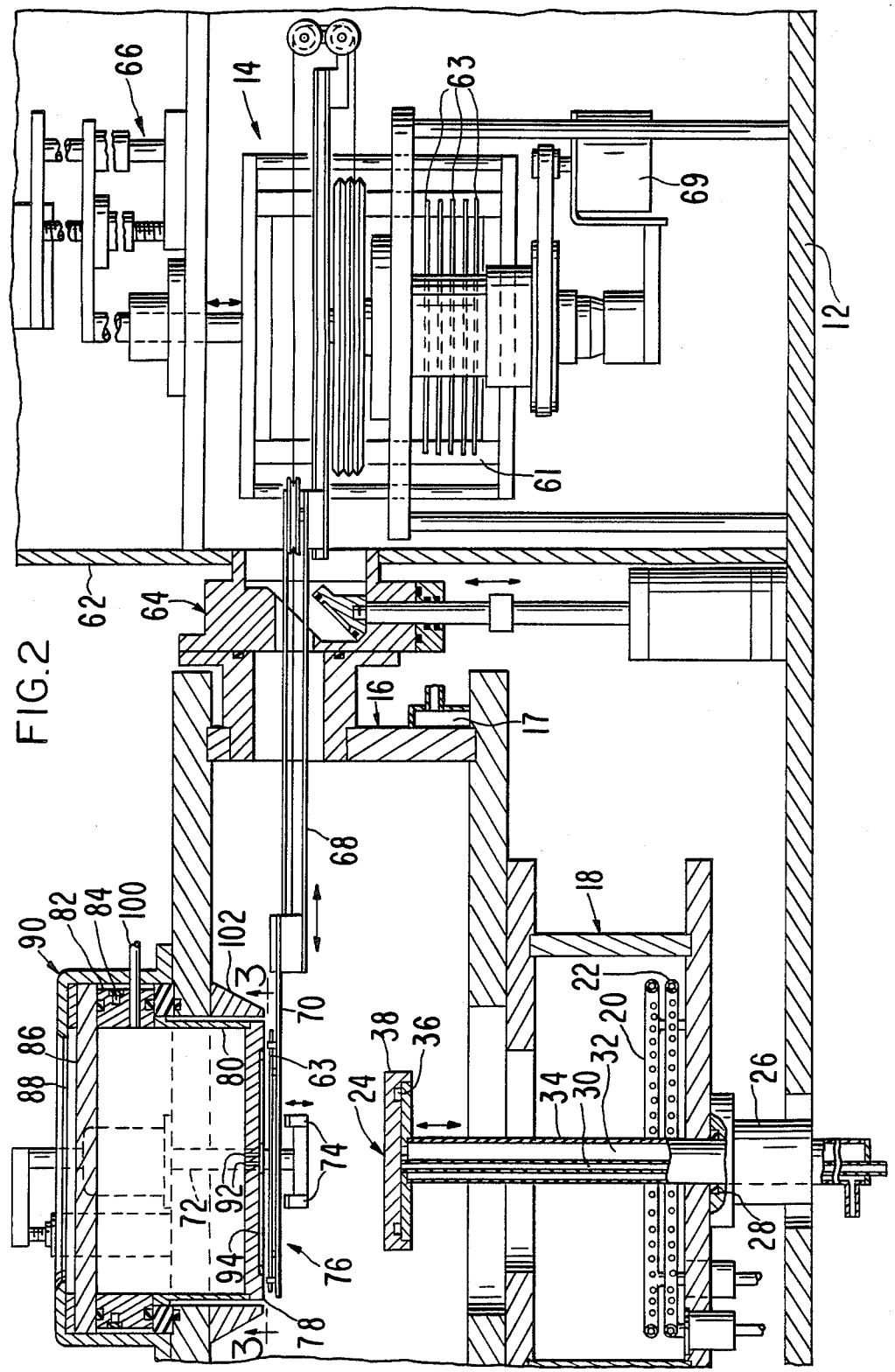
FIG. 2 is a partial sectional view of the apparatus of FIG. 1.
Figure 3:
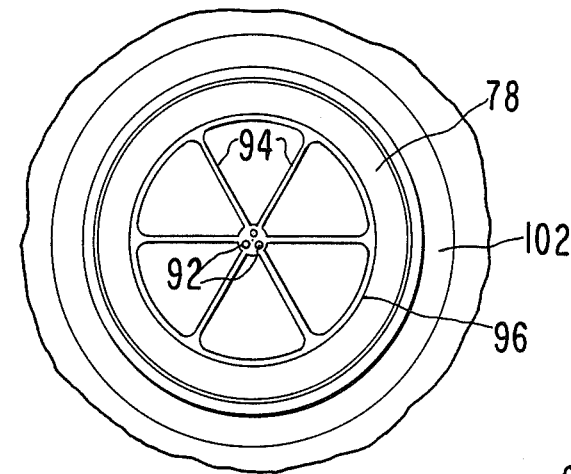
FIG. 3 is a sectional view along the section 3—3 of FIG. 2 showing the face of the chuck.
Figure 4:
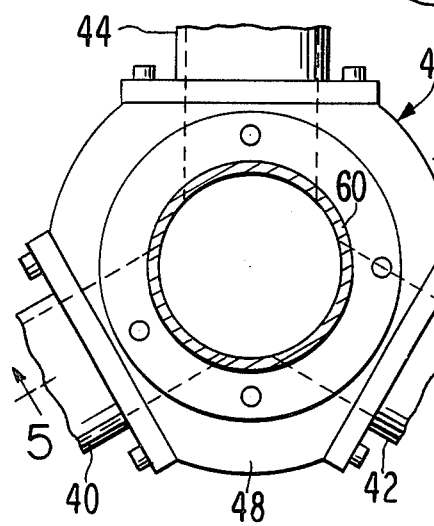
FIG. 4 is a sectional view along the section 4—4 of FIG. 1.
Figure 5:
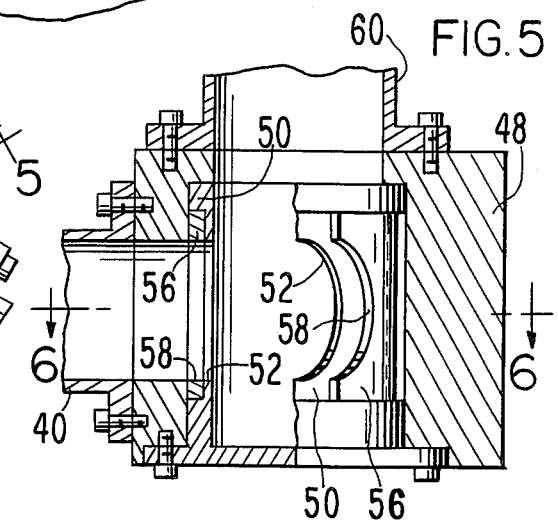
FIG. 5 is a sectional view along the lines 5—5 of FIG. 4.
Figure 6:
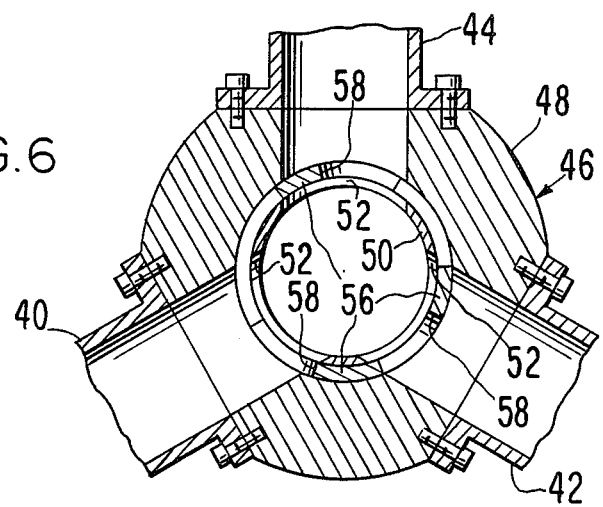
FIG. 6 is a sectional view along the lines 6—6 of FIG. 5.
Figure 7:
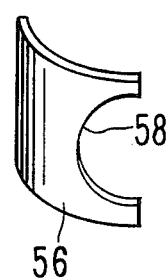
FIG. 7 is a view of the shutter shown in FIGS. 5 and 6.
Figure 8:
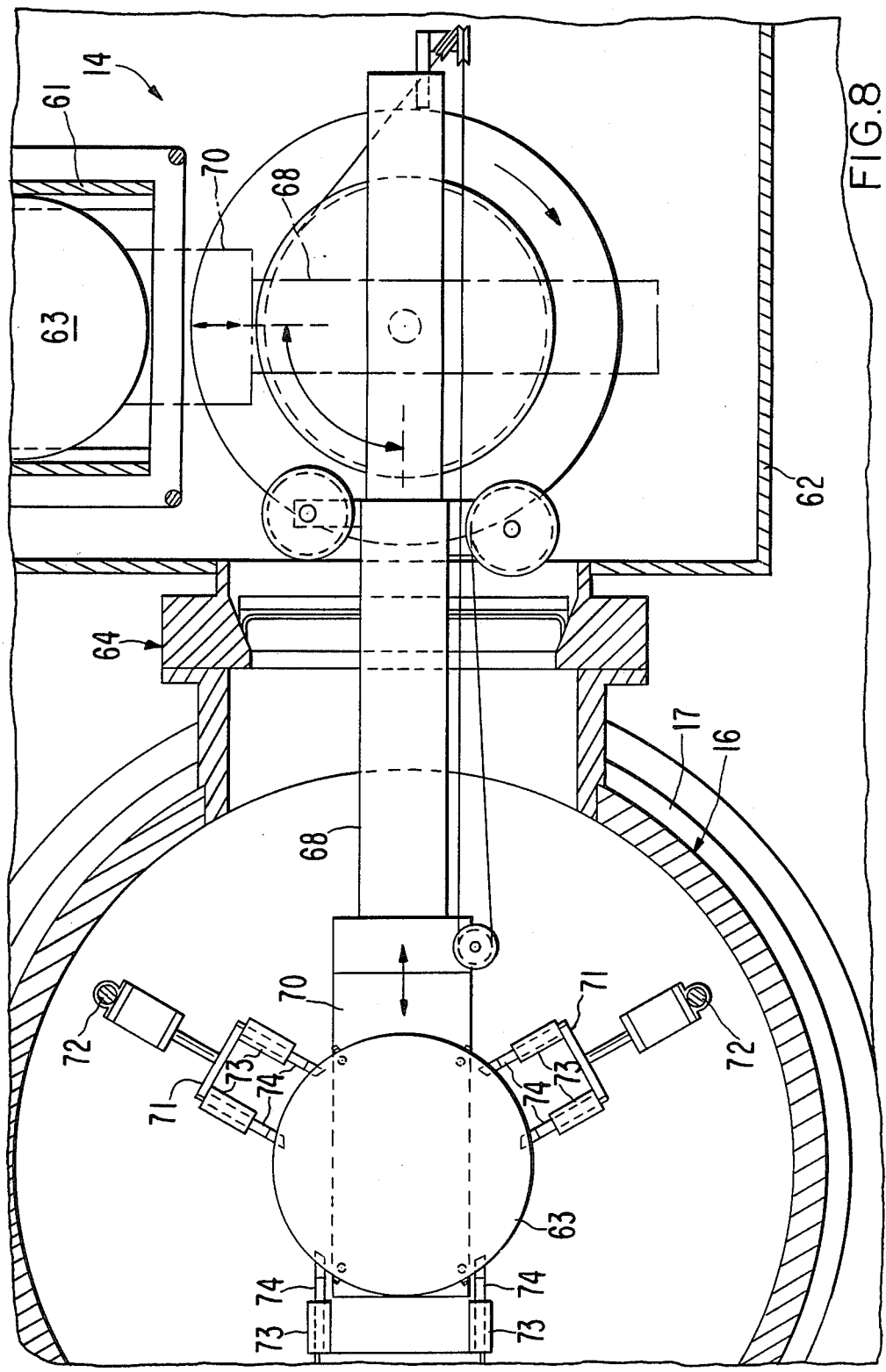
FIG. 8 is a top view of the wafer manipulator shown in FIG. 2.

In a chemical vapor deposition apparatus of the cold-wall type, one mode of operation is to inject two different reactive gases which must be completely mixed before these gases impinge on the heated work-piece. A gas-mixing chamber 18 separtate from the deposition chamber is used to control the mixing before deposition. Two gases are injected into the mixing chamber 18 through pipes in the form of upper ring 20 and lower ring 22 (see FIG. 2). Each injection ring 20, 22 is hollow to facilitate flow of gas throughout the ring and has approximately one hundred holes of seven thousandths inch diameter for injection of the gas from each ring into the mixing chamber 18. A mixing baffle 24 slidable through a stuffing gland 26 with O-ring 28 in a vertical direction of adjustment of optimum mixing. The mixing baffle 24 has coaxial channels 30, 32 in a shaft 34 and a circular ring channel 36 in a top plate 38 for circulating cooling water. The deposition chamber 16 has a water cooling channel 17 in the outer walls to reduce reactions at the walls.

To facilitate uniformity of deposition coverage of the workpiece, the deposition chamber 16 is pumped through three outlets with exhaust pipes 40, 42, 44 into a pumping manifold 46. The manifold 46, as shown in FIGS. 4–7, has an outer shell 48 attached to the pipes 40, 42, 44, and cylindrical inner shell 50 with three openings 52 into a central chamber 54. Three independently adjustable shutters 56 each with semicircular opening 58 are used to adjust the pumping from each of the three outlets. Each of the three shutters 56 are slidable between the outer shell 48 and inner shell 50 and lockable by means of a set screw (not shown). The central chamber 54 is connected to a pumping system (not shown) through pipe 60.

The deposition chamber 16 is separated from the cassette chamber 62 by a loadlock 64. In operation a cassette 61 of wafers is inserted in the cassette chamber 62, the cassette chamber 62 is sealed and then pumped. The cassette 61 is positioned by a cassette elevator 66. A manipulator arm 68 slides a blade 70 under a wafer 63 on the blade 70 and the blade 70 with wafer is withdrawn from the cassette 61. The manipulator arm 68 driven by motor 69 then turns the blade 70 through a 90° angle. The loadlock 64 is opened and the manipulator arm 68 extends carrying the blade 70 with wafer 63 into the center of the deposition chamber 16. Three lifting arms 72 each having two ceramic fingers 74 attached to support 71, lift the wafer 63 off the blade and contact the back side of the wafer 63, face down, with the chuck 76. A total of 6 ceramic fingers are used to avoid the necessity of prealigning the wafer to orient the flat. The chuck 76 is a hollow assembly having a metal face 78, walls 80 of stainless steel, metal back ring 82 with water cooling channel 84 and a quartz back plate 86. The chuck 76 extends into the deposition chamber 16 away from the top of the chamber 16 to facilitate uniform flow of gases over the wafer. A metal screen 88 attached to a metal support structure 90 is grounded to the walls of the deposition chamber 16 to keep RF power inside the chuck 76. The chuck 76 is filled with helium at 1–10 Torr. The helium bleeds through three small holes 92 about seven thousandths inch near the center of the metal face 78. A pattern of six radial grooves 94 and a circumferential groove 96 of about ninety thousandths inch radius are used to conduct heated helium across the back of the water to provide thermal contact. The chuck 76 is heated through the quartz back plate 86 by an array 98 of six water-cooled 1000 W tungsten-halogen lamps which can be used individually or in various combinations to regulate the heat.

The lamps are directed along the interior edge of the chuck to provide uniform heating. Sensors on the chuck 76 detect the temperature. The sensed temperature is sent to a central computer 110 which controls the lamps to control the temperature. The heat at the wafer can be controlled to within 1° C. from 150° C. to 950° C.

The chuck 76 can be operated in a heat-enhanced mode, or plasma-enhanced mode or a combination of both. The metal face 78 of the chuck 76 is insulated from ground by the ceramic side walls 80 and can thus support an RF potential fed by a cable means (not shown). A power level of about 100 W is sufficient for enhancing depositions on the face of the wafer. The feed line 100 for helium into the chuck 76 must be made of insulating material. A small piece of cloth gauze inserted in the feed line 100 prevents the plasma from extending up the feed line 100. Dark space shields 102 are used at the side of the chuck 76 to prevent extraneous plasma along the side walls of the chuck 76. Dark space shields 73 are also used on the ceramic fingers 74 to prevent plating which would short the insulating properties of the ceramic.

The plasma can be used to clean the deposition chamber 16, thus minimizing downtime for cleaning. With the wafer removed the RF power is increased from the deposition level of about 100 W to about 1000 W. An etch gas of $NF_3$ or $CF_4$ may be introduced at about 200 millitorr to speed the cleaning. At this power level the plasma extends to and cleans the entire deposition chamber 16.

The walls of the deposition chamber 16 are water-cooled both to prevent gas phase reactions and to prevent deposition on the chamber walls which can result in particulate contamination. The chamber walls can be made of aluminum or stainless steel. Aluminum is an excellent chamber material for use in the deposition of oxide, nitride, polysilicon, refractory metals and refractory metal silicides. Stainless steel is more suitable for other materials requiring chlorine processes.

Figure 9:
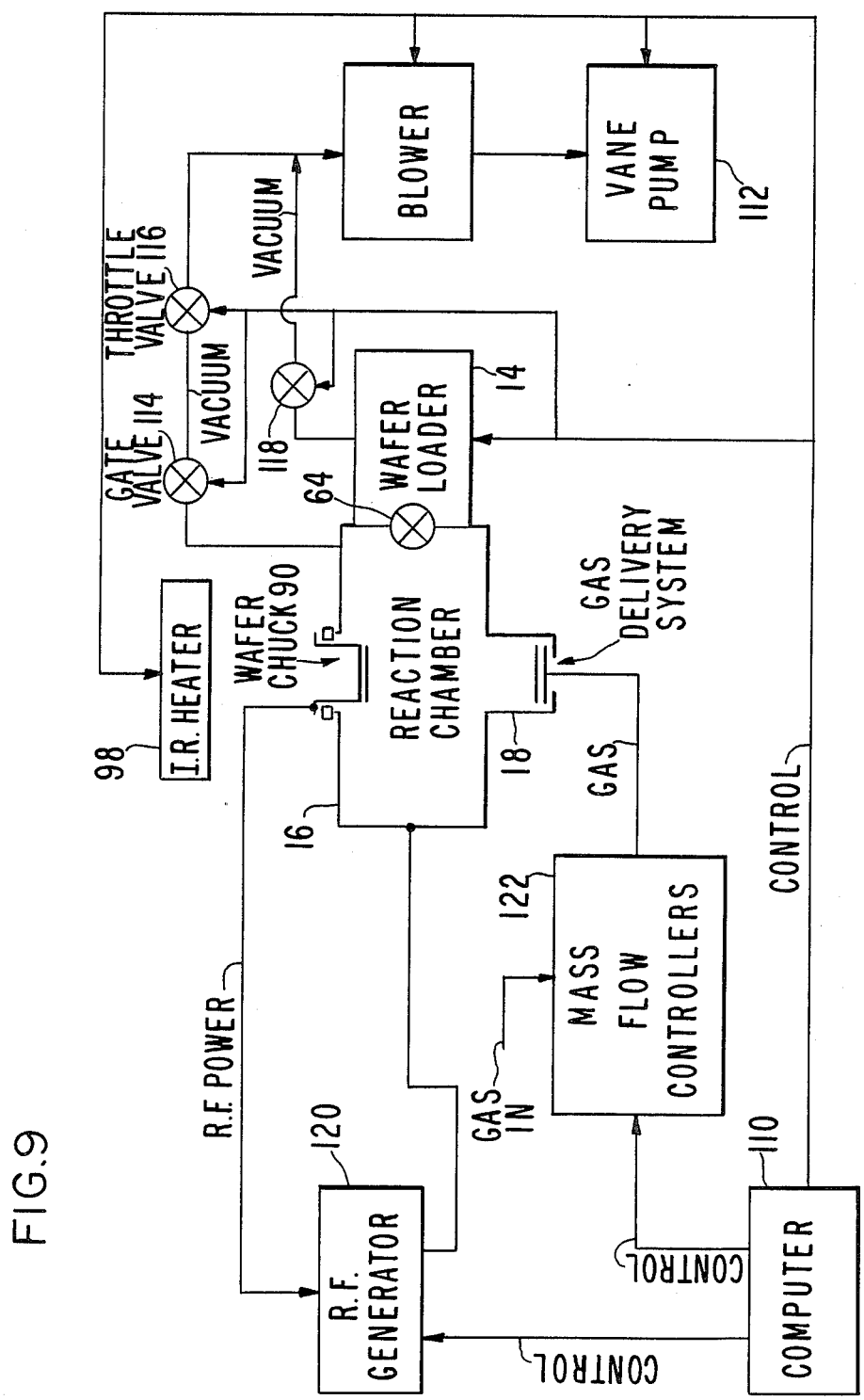
FIG. 9 is a block diagram of the system.

The entire system is controlled by a central computer 110, as shown in FIG. 9. The computer 110 controls the wafer loader 14, the pumping system 112 with various valves 114, 116, 118 and the loadlock 64. When appropriate, the computer 110 turns on the heater lamps 98, the RF power source 120, and the mass flow controllers 122 to inject gas.

This invention is not limited to the preferred embodiments and alternatives heretofore described, to which variations and improvements may be made including mechanically and electrically equivalent modifications, changes and adaptations to component parts, without departing from the scope of production of the present patent and true spirit of the invention, the characteristics of which are summarized in the appended claims.

What is claimed is:

1. An apparatus for chemical vapor deposition on a workpiece comprising:
   a deposition reaction chamber;
   a gas mixing chamber communicating with said deposition reaction chamber;
   connection means for connecting a vacuum pumping means to said deposition reaction chamber;
   gas distribution means for introducing gas into said gas mixing chamber;
   adjustable baffle means between said gas mixing chamber and said deposition reaction chamber for controlling the flow of gas from said gas mixing chamber into said deposition reaction chamber, said adjustable baffle means including a generally flat thin body attached near the center of said flat thin body to a slender support;
   chuck means for controlling the temperature of a workpiece, said chuck means being located within said deposition reaction chamber; and
   wafer holding means for holding a workpiece against said chuck means.

2. An apparatus as in claim 1 wherein said adjustable baffle means is cooled with fluids flowing in said baffle.

3. An apparatus as in claim 2 wherein said adjustable baffle means includes a disk mounted on a support.

4. An apparatus as in claim 1 wherein said gas distribution means includes at least one hollow pipe formed into a ring and having a multiplicity of small holes therein.

5. An apparatus as in claim 4 wherein said gas distribution means includes at least two closely located hollow pipes each said pipe being formed into a ring with each having a multiplicity of small holes therein.

6. An apparatus as in claim 1 wherein said connection means includes at least three outlets in said deposition reaction chamber, each said outlet having shutter means for independently adjusting the flow in each said outlet.

7. An apparatus as in claim 1 wherein said chuck means includes a means for flowing a gas across the back of the workpiece for thermal contact between said chuck and the workpiece.

8. An apparatus as in claim 7 further including a means for radiant heating said chuck means.

9. An apparatus as in claim 7 wherein said chuck means includes a means for supporting a plasma discharge on the face of a workpiece in contact with said chuck means.

10. An apparatus as in claim 9 further including a means for radiant heating said chuck means.

11. An apparatus as in claim 1 wherein said wafer holding means includes a multiplicity of ceramic fingers supporting the workpiece from below.

12. The apparatus of claim 3 wherein said gas distribution means includes at least two closely located hollow pipes each said pipe being formed into a ring having a multiplicity of small holes therein.

13. An apparatus as in claim 12 wherein said chuck means includes a means for flowing a gas across the back of the workpiece for thermal contact.

14. An apparatus as in claim 13 further including a means for radiant heating said chuck means.

15. An apparatus as in claim 14 wherein said chuck means includes a means for supporting a plasma discharge on the face of the workpiece in contact with said chuck means.

16. An apparatus as in claim 14 including a means for plasma cleaning of said apparatus.

17. An apparatus as in claim 14 including a means for reactive ion cleaning of said apparatus.

18. An apparatus for chemical vapor deposition on a workpiece comprising:
   a deposition reaction chamber having walls cooled by an internally circulating fluid;
   a gas mixing chamber communicating with said deposition reaction chamber;
   a connection means for connecting a vacuum pumping means to said deposition reaction chamber, said connection means including at least three outlets in said deposition reaction chamber, each said outlet having shutter means independently adjusting the flow in each said outlet;
   gas distribution means for introducing gas into said gas mixing chamber, said gas distribution means including at least two closely located hollow pipes, each said pipe being formed into a ring, each said pipe having a multiplicity of small holes therein;
   adjustable baffle means between said gas mixing chamber and said deposition reaction chamber for controlling the flow of gas from said gas mixing chamber into said deposition reaction chamber, said adjustable baffle means being cooled with fluids flowing in said baffle, said adjustable baffle means including a disk mounted on a support;
   chuck means for controlling the temperature of a workpiece, said chuck means including means for flowing a gas across the back of the workpiece for thermal contact, said chuck means being located within said deposition reaction chambers, said chuck means including means for radiant heating said chuck means and means for supporting a plasma discharge on the face of a workpiece in contact with said chuck means;
   wafer holding means for holding a workpiece against said chuck means, said wafer holding means including a multiplicity of ceramic fingers supporting the workpiece from below.

19. An apparatus as in claim 18 further including a means for plasma cleaning of said apparatus.

20. An apparatus as in claim 18 further including a means for reactive ion cleaning of said apparatus.

* * * * *